(12) United States Patent
Shockey

(10) Patent No.: US 6,667,837 B1
(45) Date of Patent: Dec. 23, 2003

(54) METHOD AND APPARATUS FOR CONFIGURING AN APERTURE EDGE

(75) Inventor: Stephen Michael Shockey, Rowlett, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/066,139

(22) Filed: Jan. 30, 2002

(51) Int. Cl.[7] .................. G02B 9/08; G02B 27/00; H05K 9/00

(52) U.S. Cl. ............... 359/738; 359/601; 174/35 R; 361/816

(58) Field of Search ................ 359/738, 739, 359/254, 601; 206/710, 711, 712, 723, 724, 726, 777; 174/35 R, 35 MS; 361/816, 818, 800

(56) References Cited

U.S. PATENT DOCUMENTS

| | | | |
|---|---|---|---|
| 5,061,049 A | 10/1991 | Hornbeck | |
| 5,095,664 A | 3/1992 | Zayhowski | |
| 5,264,393 A | 11/1993 | Tamura et al. | |
| 5,650,915 A | 7/1997 | Alfaro et al. | |
| 6,344,978 B1 | * 2/2002 | Komiya | 361/816 |
| 6,513,214 B2 | 2/2003 | Nishimura et al. | |

2001/0053016 A1   12/2001   Nelson

OTHER PUBLICATIONS

U.S. Ser. No. 09/938,692, filed Aug. 23, 2001, entitled "Method and Apparatus for Controlling Emission of Radiation from a Housing", by inventor Stephen Michael Shockey, 22 pages of text and 2 drawing sheets.

U.S. Ser. No. 10/045,639 filed Nov. 6, 2001 by inventors Mark B. Hanna and Kyle W. Nix for "Method and Apparatus for Making a Lid with an Optically Transmissive Window", 35 pp. of text and 8 drawing sheets (Attorney Docket No. 004578.1203) now US 20030101562.

* cited by examiner

*Primary Examiner*—Ricky Mack
*Assistant Examiner*—Alicia Harrington
(74) *Attorney, Agent, or Firm*—Baker Botts L.L.P.

(57) ABSTRACT

An apparatus (10) includes a digital micromirror device (16) disposed within a housing (11), the housing having an opening (13) which is sealed by a lid (17). The lid includes a metal frame (21), a radiation transmissive window element (41) supported in an opening (23) provided through the frame, and a chrome layer (42) provided on one side of the window element. The chrome layer has an aperture (43) through it, and the edge portion (61) of the chrome layer adjacent the aperture forms with respect to the window element an acute angle (62) which is larger than in pre-existing devices. A technique for forming this acute angle involves the use of a positive photoresist material (101).

15 Claims, 2 Drawing Sheets

METHOD AND APPARATUS FOR CONFIGURING AN APERTURE EDGE

TECHNICAL FIELD OF THE INVENTION

The present invention relates in general to a lid having a radiation transmissive window and, more particularly, to such a lid having adjacent the window an opaque layer with an aperture therethrough.

BACKGROUND OF THE INVENTION

An existing device includes a housing with an opening therein which is closed by a lid, the lid having a frame and having a window which is hermetically sealed to the frame, the window being transmissive to radiation in a waveband of interest. A chrome layer is provided on one side of the window, and has therethrough a generally rectangular aperture with straight sides and slightly rounded corners. The device includes within the housing a digital micromirror device (DMD) of a known type.

A beam of radiation enters the housing through the window in the lid, and is processed by the DMD to form a plurality of sub-beams. Some of the sub-beams then exit the housing through the aperture and window, in order to facilitate generation of an image which is projected onto a screen, for example in a television or a movie theater. Although known lids of this type have been generally adequate for their intended purposes, they have not been satisfactory in all respects.

In this regard, when the sub-beams that exit the housing through window and aperture form a projected image on a screen, this image is typically -surrounded by a border region which is intended to be relatively dark. However, a noticeable line or zone of bright light sometimes appears within the dark border region. In some cases, two or more of these undesirable lines or zones of light appear at the same time. These undesirable lines of light were believed to be caused in some way by the known lid, although there was no clear understanding of exactly how the lid might be causing this problem.

SUMMARY OF THE INVENTION

From the foregoing, it may be appreciated that a need has arisen for a method and apparatus involving a lid that avoids undesirable regions of illumination in the border around a projected image. According to a first form of the present invention, a method and apparatus are provided to address this need, and involve: providing a window which is transmissive to radiation of a predetermined wavelength and which has a surface thereon; providing adjacent the surface on the window a layer which is nontransmissive to radiation of the predetermined wavelength, and which has an aperture therethrough; and configuring an edge of the layer that extends around the circumference of the aperture to have a slope which extends at an acute angle greater than approximately 15° with respect to the surface on the window.

According to a different form of the present invention, a method involves: providing a window which is transmissive to radiation of a predetermined wavelength and which has thereon a surface with first and second portions; forming a layer of a positive photoresist material on first and second portions of the surface; removing a selected portion of the photoresist material on the first portion of the surface so as to leave a remaining portion of the photoresist material on the one-second portion of the surface; applying over the remaining portion of the photoresist material and over the first portion of the surface a layer of a further material which is nontransmissive to radiation of the predetermined wavelength, including application of the further material in directions other than perpendicular to the surface so that the further material on the first portion of the surface has an edge portion which is adjacent to and extends around the remaining portion of the photoresist, and which is sloped to extend at an acute angle greater than approximately 15° with respect to the surface; and thereafter removing the remaining portion of the photoresist material and the portion of the further layer thereon, so as to leave through the further material an aperture which has the edge portion of the further layer extending along a circumference thereof.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
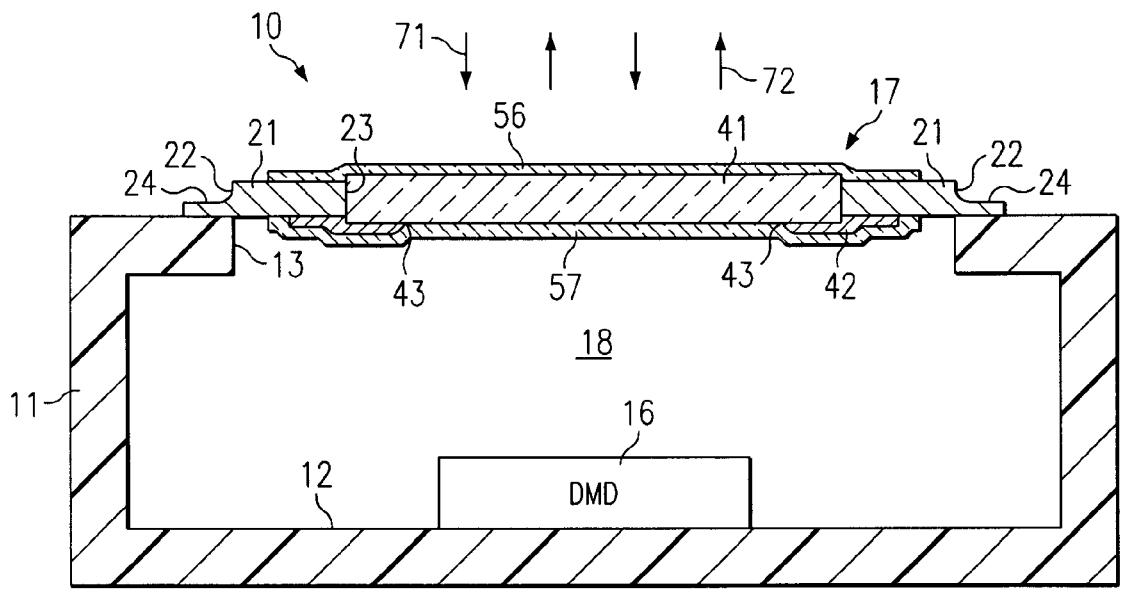
FIG. 1 is a diagrammatic sectional side view of an apparatus which embodies aspects of the present invention.

FIG. 1 is a diagrammatic sectional side view of an apparatus 10 which embodies aspects of the present invention. In the drawing figures, including FIG. 1, certain structure is not shown to scale, in order to provide clarity, and in order to convey a clear understanding of the present invention. As one example, it will become evident from the following discussion that the thickness of some layers is exaggerated in the drawings in comparison to the thickness of other layers. As another example, and for similar reasons, some angles are depicted with an exaggerated size.

In FIG. 1, the apparatus 10 includes a housing 11 which has a chamber 12 therein, and which has a top wall with a vertical opening 13 through it. A digital micromirror device (DMD) 16 of a known type is supported within the chamber 12, at a central location on the top surface of the bottom wall of the housing 12.

The DMD 16 falls within a class of devices commonly known as micro-electro-mechanical system (MEMS) devices.

The DMD 16 has on the upper side thereof a two-dimensional array of tiny reflective mirrors, which are not visible in the drawings. The mirrors each correspond to a respective pixel of an image, and can each be independently physically moved by the DMD 16 in response to electrical control signals.

A lid 17 is provided on top of the housing. The peripheral edges of the lid 17 are seam welded in a known manner to the top surface of the housing 11, in a manner effecting a hermetic seal between the interior and exterior of the housing 11. A gas is provided in the region 18 within the chamber 12, and the lid 17 ensures that this gas does not escape from the chamber 12. The gas serves to lubricate the mirrors in the two-dimensional array on the DMD 16, in order to facilitate their movement, and to ensure that they have a relatively long operational lifetime. However, this gas is also somewhat corrosive, and the housing 11 and lid 17 of the disclosed embodiment are thus configured to be resistant to corrosive damage from the gas.

Figure 2:
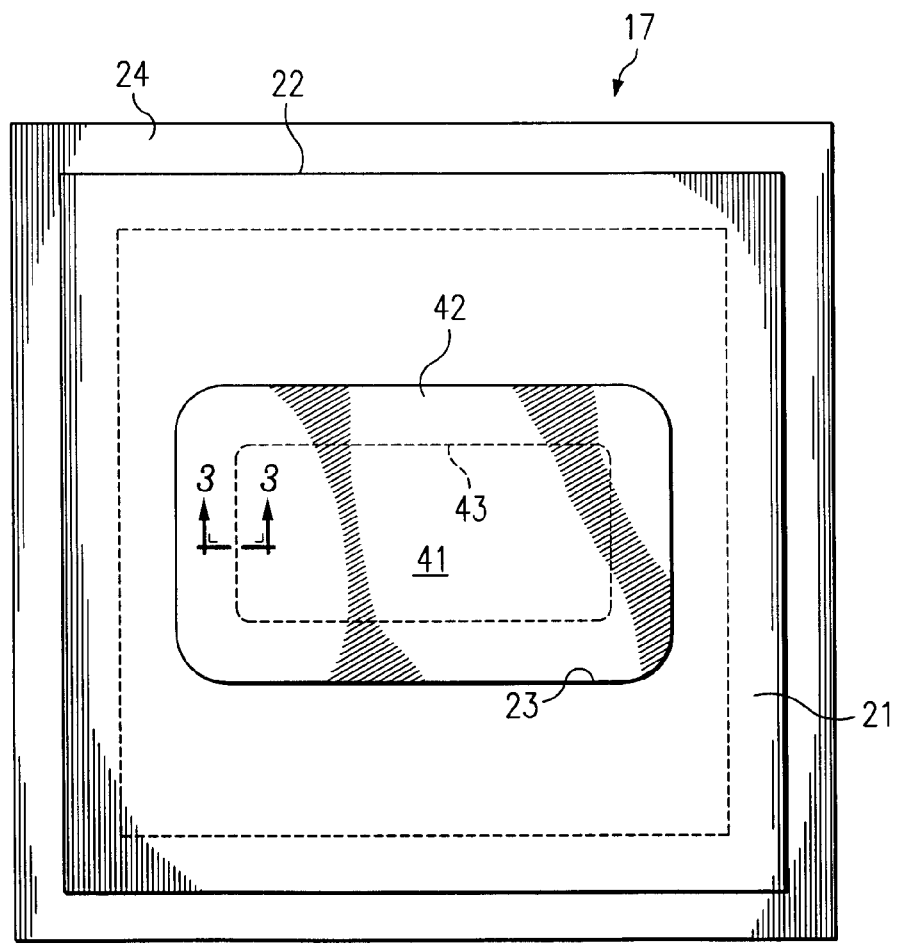
FIG. 2 is a diagrammatic top view of a lid which is a component of the apparatus of FIG. 1.

Turning in more detail to the lid 17, FIG. 2 is a diagrammatic top view of the lid 17, with an antireflective coating omitted for clarity. With reference to FIGS. 1 and 2, the lid 17 includes a platelike metal frame 21, which in the disclosed embodiment is made from a commercially available steel material such as ASTM-F15. The frame 21 has an approximately square shape, and has an annular recess 22 of rectangular cross section which extends along the entire peripheral edge of the frame on the upper side thereof, so as to define an outwardly projecting annular flange 24. As shown in FIG. 1, the flange 24 engages an annular surface portion which is provided on top of the housing 11, and which extends around the opening 13.

The frame 21 has an opening 23 which extends vertically through the center of the frame. In the disclosed embodiment, the opening 23 is of approximately rectangular shape, except that the corners are rounded. A platelike window 41 has a peripheral edge with the same shape and size as the opening 23, and is fixedly secured within the opening 23. More specifically, the window 41 is a platelike glass element having parallel top and bottom surfaces. In the disclosed embodiment, the glass element 41 is made from a borosilicate glass material, such as that commercially available as catalog number 7056 from Corning Incorporated of Danville, VA. This particular glass material is transmissive to radiation in a range which is centered around a wavelength of about 545 nm, and which extends from approximately 420 nm to about 700 nm. However, it would alternatively be possible to use a different material which is transmissive to radiation in a different range of wavelengths. During assembly of the lid 17, the frame 21 and glass element 41 are heated to a temperature at which the peripheral edge of the glass element 41 softens, and then the lid is cooled back to room temperature in order to fuse the peripheral edge of the glass element to the circumferential edge of the opening 23 in a known manner.

The glass element 41 has on the lower side thereof a thin chrome layer 42. The chrome layer 42 has a thickness of approximately 1,500 Å, and is non-transmissive to radiation with wavelengths in the range of interest, from approximately 420 nm to 700 nm. As best seen in FIG. 2, the chrome layer 42 has an aperture 43 extending vertically through it. In the disclosed embodiment, the chrome layer 42 includes three sub-layers which are not separately depicted, in particular two spaced chromium layers with a chromium oxide layer sandwiched between them. However, the layer 42 could alternatively be made of some other suitable material, or could have some other suitable configuration.

The glass element 41 and the chrome layer 42 are sandwiched between two coatings 56 and 57 of an anti-reflective material. In the disclosed embodiment, the anti-reflective coatings 56 and 57 are each multi-layer coatings of type known in the art. Therefore, the various layers and the materials from which they are made are not illustrated and described here in detail. It is sufficient to mention here that the outermost layer of the coating 57 on the bottom of the lid 17 is made from a material which is resistant to the corrosive nature of the gas provided within the region 18 of the housing 11. In the disclosed embodiment, this material is magnesium fluoride, but it could alternatively be some other suitable material, such as silicon dioxide. The coatings 56 and 57 each have a thickness of approximately 2,600 Å. The coatings 56 and 57 are transmissive to radiation within the range of interest, which as noted above includes wavelengths from about 420 nm to about 700 nm.

In a variation of the disclosed embodiment, which is not separately illustrated, the anti-reflective coating 57 can be applied to the glass element 41 before the chrome layer 42. Then, the chrome layer 42 can be formed on the anti-reflective coating 57.

Figure 3:
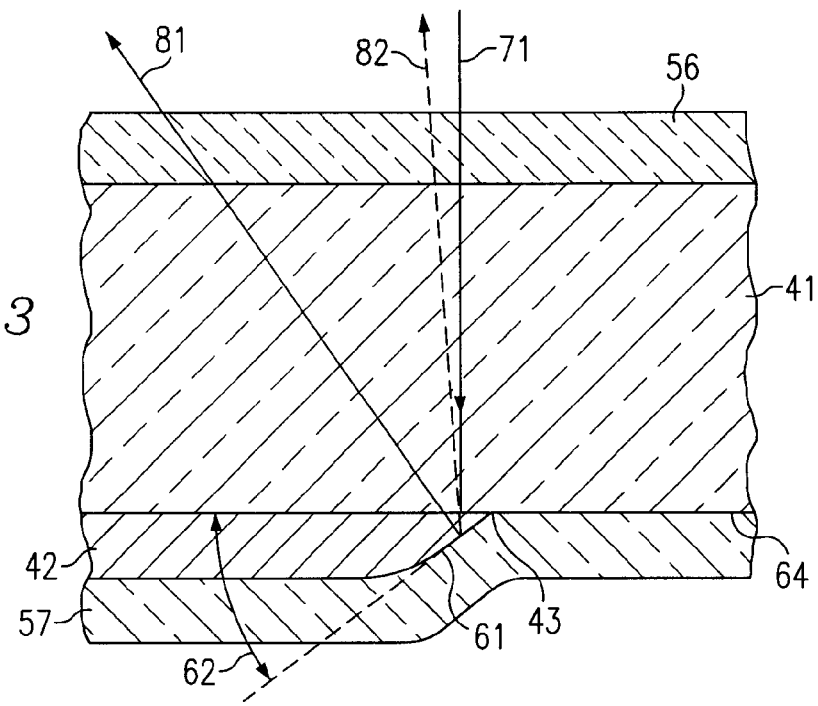
FIG. 3 is a diagrammatic sectional side view taken along the section line 3—3 in FIG. 2, and shows a selected portion of the lid of FIG. 2.

FIG. 3 is a diagrammatic fragmentary sectional side view taken along the section line 3—3 in FIG. 2, and depicts a portion of the lid 17 of FIG. 1 in an enlarged scale. As shown in FIG. 3, the chrome layer 42 has, extending adjacent its innermost edge which defines the aperture 43, a circumferential edge portion 61 which is sloped or tapered at an acute angle 62 with respect to the bottom surface 64 of the glass element 41. In the disclosed embodiment, the angle 62 is approximately 22.5°. In pre-existing lids, the angle of the taper or slope is substantially smaller, for example 4° to 6°.

The operation of the embodiment of FIGS. 1–3 will now be briefly described. A beam of in-bound radiation, indicated diagrammatically by two arrows 71 in FIG. 1, passes through the glass element 41 and the anti-reflective layers 56–57, and travels to the DMD 16. Each mirror of the DMD 16 reflects a respective portion of the beam in a respective direction determined by the current physical position of that mirror. These various independently reflected portions of the original beam are each referred to here as a sub-beam. These sub-beams then travel away from the DMD 16 in various different directions, and at least some of them will travel back out through the glass element 41 and the anti-reflective coatings 56–57, as indicated diagrammatically by two arrows 72. For simplicity, the arrows representing inbound radiation 71 and outbound radiation 72 are shown as vertical lines in FIG. 1, but it will recognized that various different beams and sub-beams would typically be traveling in various different directions.

Generally speaking, when any one of the mirrors of the DMD is in its "on" state, incoming radiation 71 which reaches that mirror will be reflected to travel back out through the glass element 71 and the coatings 56–57. In contrast, when a mirror is in its "off" state, incoming radiation 71 which reaches that mirror will be reflected so that it travels in a direction other than toward the glass element 41, and in general this radiation will be dissipated within the housing 11. In the disclosed embodiment, several rows of the mirrors located around the periphery of the two-dimensional array of mirrors are all kept continuously in the "off" state, in order to define a ring of mirrors which are always off and which thus provide a well-defined rectangular edge or border around the image produced by the remaining mirrors. Whenever each remaining mirror is in its "on" state, it will reflect radiation in the form of a respective sub-beam which travels back out through the glass element 41 and the coatings 56–57. All of these sub-beams from mirrors in the "on" state pass through the aperture 43 within the chrome layer 42, at locations spaced inwardly from the edge 43 of the chrome layer 42.

With reference to FIG. 3, some of the radiation 71 which passes through the anti-reflective coating 56 and the glass element 41 will impinge on the chrome layer 42. As mentioned above, chrome layer 42 includes three sub-layers, with a central sub-layer of chromium oxide sandwiched between two layers of chromium. The chromium oxide tends to absorb radiation in the range of interest. Thus, where the chrome layer 42 has its full thickness, radiation 71 which impinges on the chrome layer 42 will tend to be absorbed.

However, in the tapered edge portion 61 of the chrome layer 42, the chromium oxide sub-layer also tapers. The chromium oxide sub-layer is thus not as thick in the edge portion 61 as elsewhere in the layer 42, and is thus less capable of absorbing radiation 71. As a consequence, the edge portion 61 can reflect some of the radiation 71, as indicated diagrammatically at 81.

As explained above, the edge portion 61 of the disclosed embodiment is sloped at an acute angle 62 of 22.5°, which is a sufficiently large angle so that reflected radiation 81 travels in a direction significantly different from the reflected sub-beams 72 (FIG. 1) which form the image of interest. According to the invention, in order to avoid the undesired optical effects, the angle 62 should be greater than about 15°, and preferably greater than about 20°. In contrast, and as discussed later, there are pre-existing lids in which the angle of the edge 61 is much smaller, for example 4° to 6°.

In such a pre-existing lid, the edge portion of the chrome layer could reflect radiation in a direction only slightly different from the direction of the sub-beams 72, as indicated diagrammatically at 82. The reflection in the direction 82 may also have a higher intensity than the reflection 81, for example due to different thicknesses of energy-absorbing chromium oxide in the respective edge portions that produce these reflections. Consequently, in a system using the pre-existing lid, the unwanted reflection at 82 could produce undesirable lines or zones of light in the border around the projected image. But since the edge portion 61 in the disclosed embodiment has a significantly larger angle 62 than in pre-existing lids, any unwanted reflection such as that at 81 travels in directions significantly different from the direction in which the image travels, thereby avoiding undesirable lines or zones of light in the border around the projected images.

A technique will now be described for fabricating the edge portion 61 of the chrome layer 42 in a manner so that it has the advantageous angle 62 of about 22.5°. Since suitable fabrication techniques for most aspects of the lid 17 are already known in the art, the following discussion does not address the entire procedure for fabricating the lid 17, but instead is focused on the portion of that procedure which relates to fabrication of the chrome layer 42 in a manner so that its edge portion 61 has a suitable slope or taper.

Figure 4:
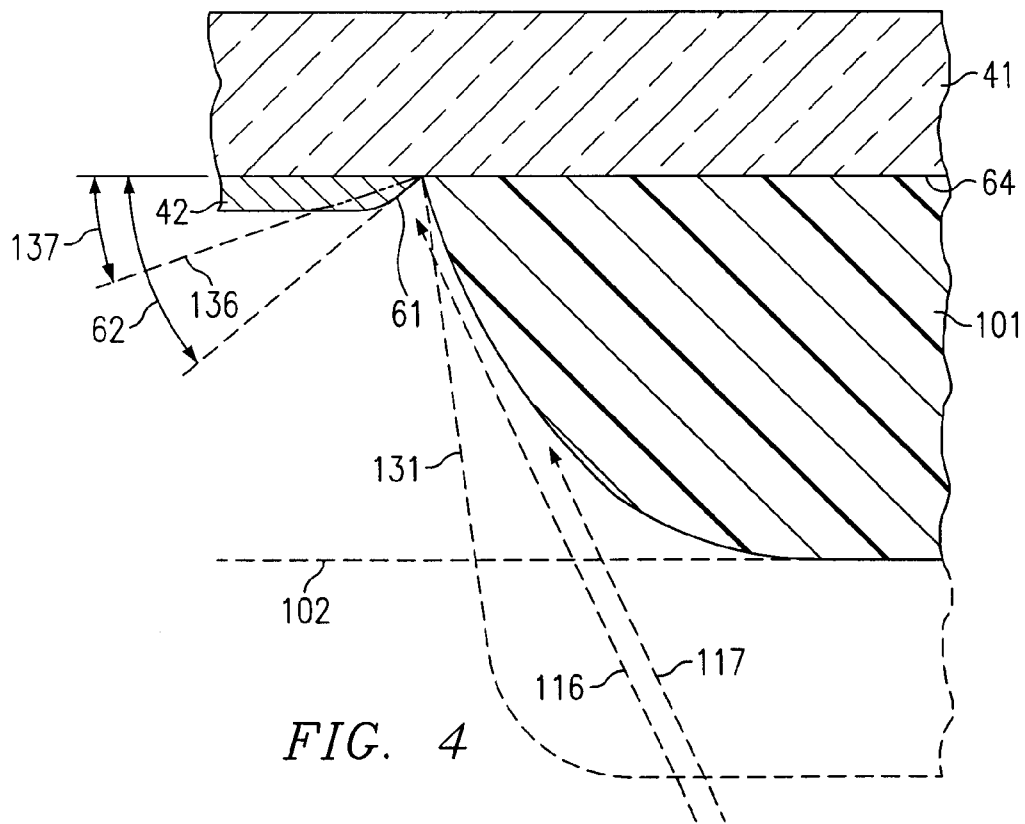
FIG. 4 is a diagrammatic sectional side view similar to FIG. 3, but showing the selected portion of the lid at an intermediate stage during its fabrication.

In this regard, FIG. 4 is a diagrammatic fragmentary sectional side view similar to FIG. 3, but showing an earlier stage in the fabrication process for the lid 17, before the anti-reflective coatings 56–57 are applied. Before the chrome layer 42 is formed, a layer 101 of a negative photoresist material is formed on the surface 64 of the glass element 41. In the disclosed embodiment, the photoresist 101 is a material commercially available as catalog no. S1818 from Shipley Company L.L.C. of Marlborough, Mass. Equivalent photoresist materials are available from other manufacturers, and it would also be possible to alternatively use some other suitable positive photoresist material.

The photoresist material 101 is applied so as to have across the surface 64 a substantially uniform thickness, which is several times the intended thickness of the chrome layer 42. This substantially uniform thickness is indicated diagrammatically in FIG. 4 by the broken line 102. In the disclosed embodiment, the photoresist material 101 has a thickness of approximately 2.4 μm to approximately 2.7 μm, or in other words a thickness which is approximately 16.3 times the intended thickness of the chrome layer 42.

One suitable technique for applying the photoresist material 101 with a suitable thickness is to place a predetermined quantity of the photoresist material 101 in the center of the surface 64, and then rotate the lid 17 containing the glass element 41 at a suitable speed for a suitable time interval so that centrifugal forces will effect the uniform distribution of the photoresist material across the surface 64. However, it would alternatively be possible to use any other suitable technique which will apply the photoresist material 101 with the desired thickness. For example, with appropriate selection of the photoresist material, it would be possible to spray it onto the rotating lid.

Next, a not-illustrated glass master pattern of a known type is placed closely adjacent the layer of photoresist material 101. The pattern has an approximately rectangular mask in the region where the aperture 43 (FIG. 2) is to exist. The photoresist material 101 is exposed to light through the glass master pattern, and then the pattern is removed. After that, the lid 17 with the photoresist material 101 is placed in a chemical bath of a known type, which removes the portions of the photoresist material 101 that were exposed to the light, thereby leaving the portion of the layer of photoresist material 101 which is shown solid lines in FIG. 4, which was shielded from the light by the mask.

Next, the chrome layer 42 is formed. In the disclosed embodiment, this is carried out by effecting planetary rotation of the glass plate 41 within a not-illustrated vacuum chamber containing a quantity of chrome which is spaced from the glass plate 41 and which serves as a source of chrome. Due to the vacuum, chrome evaporates from the source, and is deposited elsewhere in the chamber, including not only the surface 64 of the glass plate 41, but also the outer surface of the photoresist material 101. Although the chamber is under a vacuum throughout this procedure, approximately one-third of the way through the procedure a quantity of oxygen is introduced into the chamber, so that the material subsequently deposited is chromium oxide rather than chromium. Then, approximately two-thirds of the way through the procedure, the chamber is pumped down to remove the oxygen, so that chromium is being deposited again. Consequently, the chrome layer 42 effectively has three sub-layers which are not separately illustrated, including two sub-layers of chrome with a sub-layer of chromium oxide sandwiched between them. Although the disclosed embodiment uses a vacuum to evaporate chromium material from a source and then deposit this material on the glass plate 41, any other suitable technique could alternatively be used to form the chrome layer 42, such as sputtering of chrome material.

Due to factors such as the above-mentioned planetary movement of the glass plate 41, chromium and/or chromium oxide material will approach the glass plate 41 and the photoresist material 101 in a variety of directions, most of which are not perpendicular to the surface 64. Consequently, since the photoresist 101 is about sixteen times thicker than the intended thickness of the chrome layer 42, the photoresist layer 101 will tend to "shadow" a region of the surface 64 on the glass element 41 which is disposed immediately adjacent and extends around the photoresist layer 101. Thus, for example, chromium or chromium oxide material traveling along the path 116 will pass the photoresist 101 and be deposited on the surface 64 near the photoresist layer 101. On the other hand, chromium or chromium oxide material traveling along an adjacent path 117 moves in a direction which would take it to a portion of the surface 64 very close to the edge of the photoresist material 101. However, before this material can reach the surface 64, it impinges on the photoresist layer 101, and is deposited there. For clarity, the chrome and chromium oxide material deposited on the photoresist layer 101 is not depicted in the drawings.

As a result of this shadowing effect, the amount of chrome and chromium oxide material deposited on the surface 64 in the region closely adjacent the photoresist layer 101 is smaller than the amount deposited on other portions of the surface 64. This produces the tapered or sloped edge portion 61 of the chrome layer 42, which forms the acute angle 62 with respect to the surface 64.

After the chrome layer 42 has been formed, the assembly which includes the frame 21, glass plate 41, photoresist layer 101 and chrome layer 42 is placed in a chemical bath of a known type in order to dissolve the photoresist layer 101, thereby removing all of the remaining photoresist material 10 from the surface 64 of the glass element 41. Chrome and chromium oxide material which has been deposited on the photoresist layer 101 is too thin to remain in place without the support of the photoresist layer 101, and therefore flakes away as the photoresist layer 101 dissolves. The chrome layer 42, which has been deposited directly on the surface 64 of the glass plate 41, remains in place, and is the chrome layer 42 as depicted as FIGS. 1–3.

Pre-existing techniques for fabricating a lid have used a negative photoresist rather than a positive photoresist such as that shown at 101. As known in the art, a negative photoresist is a photoresist in which the portion that chemically dissolves away following a patterned exposure to light is the portion which has not been exposed to light, rather than the portion which has been exposed to light. At the end of this chemical process, a negative photoresist will tend to have an edge which forms a much steeper angle in relation to the surface 64, as shown diagrammatically in FIG. 4 by the broken line 131. It will be noted that chrome or chromium oxide material traveling along the path 116 will reach the surface 64 of the glass plate 41 when the positive photoresist material 101 is used. In contrast, when the negative photoresist material 131 is used, chrome or chromium oxide material traveling along the path 116 impinges on the photoresist layer 131, and is deposited there without ever reaching the surface 64.

Consequently, use of the negative photoresist material 131 will result in an edge portion for the chrome layer 42 which is indicated diagrammatically by a broken line 136 in FIG. 4, and which forms a very small acute angle 137 of approximately 40 to 60 with respect to the surface 64. As discussed above in association with FIG. 3, the edge portion 136 with this small acute angle 137 can produce reflections in directions such as that shown at 82 in FIG. 3, which in turn leads to undesirable optical effects. In contrast, the edge portion 61 has a significantly larger acute angle 62, which causes reflections to travel in directions such as that shown at 81 in FIG. 3, thereby avoiding the unwanted optical effects.

The present invention provides several technical advantages. One such technical advantage is that undesirable optical effects are reliably avoided in the border around a projected image. This is achieved by the increased slope of the edge portion of the chrome layer, which changes the intensity and/or direction of travel of certain unwanted reflections. A related advantage results from the provision of a fabrication procedure for forming the chrome layer with an edge portion having the desired slope. Still another related advantage is realized where this fabrication procedure involves the use of a positive photoresist material rather than a negative photoresist material, thereby avoiding additional process steps or additional costs in comparison to pre-existing fabrication procedures.

Although one embodiment has been illustrated and described in detail, it will be understood that substitutions and alterations are possible without departing from the spirit and scope of the present invention, as defined by the following claims.

What is claimed is:

1. An apparatus comprising a lid that includes:
    a window which is transmissive to radiation of a predetermined wavelength and which has a surface on one side thereof; and
    a layer adjacent said surface on said window which is nontransmissive to radiation of said predetermined wavelength and which has an aperture provided therethrough, said layer having an edge that extends around the circumference of said aperture and that is sloped to extend at an acute angle greater than approximately 15° with respect to said surface.

2. An apparatus according to claim 1, wherein said acute angle is greater than approximately 20°.

3. An apparatus according to claim 2, wherein said acute angle is approximately 22.5°.

4. An apparatus according to claim 1, including two spaced coatings of an anti-reflective material, said window and said layer each being disposed between said coatings.

5. An apparatus according to claim 1, wherein said lid includes a frame having an opening therethrough, said window being fixedly secured within said opening through said frame.

6. An apparatus according to claim 1, including a housing having therein a chamber and having therethrough an opening which communicates with said chamber, said lid obstructing said opening and being sealed to said housing; and including a digital micromirror device supported within said housing with a selected orientation in relation to said window.

7. A method, comprising the steps of:
    providing a window which is transmissive to radiation of a predetermined wavelength and which has a surface thereon;
    providing adjacent said surface on said window a layer which is nontransmissive to radiation of said predetermined wavelength, and which has an aperture therethrough; and
    configuring an edge of said layer that extends around the circumference of said aperture to have a slope which extends at an acute angle greater than approximately 15° with respect to said surface.

8. A method according to claim 7, wherein said configuring step includes the step of selecting said acute angle to be greater than approximately 20°.

9. A method according to claim 8, wherein said configuring step includes the step of selecting said acute angle to be approximately 22.5°.

10. A method, comprising the steps of:
    providing a window which is transmissive to radiation of a predetermined wavelength and which has thereon a surface with first and second portions;
    forming a layer of a positive photoresist material on said first and second portions of said surface;
    removing a selected portion of said photoresist material on said first portion of said surface so as to leave a remaining portion of said photoresist material on said second portion of said surface;
    applying over said remaining portion of said photoresist material and over said first portion of said surface a layer of a further material which is nontransmissive to radiation of said predetermined wavelength, including application of said further material in directions other than perpendicular to said surface so that said further material on said first portion of said surface has an edge portion which is adjacent to and extends around said remaining portion of said photoresist, and which is sloped to extend at an acute angle greater than approximately 15° with respect to said surface; and thereafter removing said remaining portion of said photoresist material and the portion of said further layer thereon, so as to leave through said layer of said further material an aperture which has said edge portion of said further layer extending along a circumference thereof.

11. A method according to claim 10, including the step of causing said slope of said edge portion to be greater than approximately 20°.

12. A method according to claim 11, including the step of causing said slope of said edge portion to be approximately 22.5°.

13. A method according to claim 10, wherein said step of removing said selected portion includes the steps of: patterning said layer of photoresist material so as to differentiate said selected portion from said remaining portion, and then chemically removing said selected portion of said photoresist material.

14. A method according to claim 10, wherein said steps of forming said layer of photoresist material and applying said layer of further material are carried out so that said layer of photoresist material is several times thicker than said layer of further material.

15. A method according to claim 14, wherein said steps of forming said layer of photoresist material and applying said layer of further material are carried out so that said layer of photoresist material is approximately sixteen times thicker than said layer of further material.

* * * * *